United States Patent [19]
Itatani et al.

[11] Patent Number: 5,895,227
[45] Date of Patent: Apr. 20, 1999

[54] METHOD OF FABRICATING A PHOTO-DEVICE

[75] Inventors: Taro Itatani; Kazuhiko Matsumoto; Masami Ishii; Tadashi Nakagawa; Yoshinobu Sugiyama, all of Tsukuba, Japan

[73] Assignee: Agency of Industrial Science & Technology, Ministry of International Trade & Industry, Tokyo, Japan

[21] Appl. No.: 08/863,632

[22] Filed: May 27, 1997

Related U.S. Application Data

[62] Division of application No. 08/590,345, Jan. 23, 1996, Pat. No. 5,661,328.

[30] Foreign Application Priority Data

Jan. 23, 1995 [JP] Japan ................................. 7-8082
Jan. 23, 1995 [JP] Japan ................................. 7-8083

[51] Int. Cl.$^6$ ................................. H01L 21/469
[52] U.S. Cl. ................. 438/69; 438/57; 438/88
[58] Field of Search ................. 438/57, 69, 88, 438/93, 94, 98

[56] References Cited

FOREIGN PATENT DOCUMENTS

| | | | |
|---|---|---|---|
| 2-129970 | 5/1990 | Japan | 257/432 |
| 63-86481 | 4/1998 | Japan | 257/432 |
| 1167063 | 10/1969 | United Kingdom | 257/432 |

OTHER PUBLICATIONS

K. Matsumoto, et al. "Application of STM nanometer-size oxidation process to planar-type MIM diode"; Japanese Journal of Applied Physics, Part 1; vol. 34; Feb. 1995, pp. 1387–1390, XP00059947.

"Nanoscale Tera-Hertz Metal-Semiconductor-Metal Photodetectors"; IEEE Journal of Quantum Electronics; vol. 28, No. 10; Oct. 1, 1992, pp. 2358–2368, XP000565156.

H. Sugimura, et al. "Tip-induced anodization of titanium surfaces by scanning tunneling microscopy: a humidity effect on nanolithography"; Applied Physics Letters; vol. 63, No. 9.; Aug. 30, 1993; pp. 1288–1290, XP002023749.

Chia–Chi Wang, et al. "Ultrafast, All–Silicon Light Modulator"; Optics Letter; vol. 19, No. 18 ; 15 Sep. 1994; pp. 1453–1455, XP000472099.

U. Prank et al. "Metal-Semiconductor-metal Photodetector with Integrated Fabry-Perot Resonator for Wavelength Demultiplexing High Bandwidth Receivers"; Applied Physics Letters; vol. 62, No. 2, Jan. 11, 1993; pp. 129–130, XP000332226.

T. Itatani et al. "Ultrafast metal–semiconductor–metal photoconductive switches fabricated using an atomic force microscope"; Japanese Journal of Applied Physics, Part 1; vol. 35; Feb. 1996; pp. 1387–1389; XP000614759.

*Primary Examiner*—Chandra Chaudhari
*Assistant Examiner*—Keith Christianson
*Attorney, Agent, or Firm*—Oblon, Spivak, McClelland, Maier & Neustadt, P.C.

[57] ABSTRACT

A method of fabricating a photo-device includes the steps of forming an optically nontransparent, electrically conductive layer on the surface of a photoelectric conversion substrate, and transferring a portion of the optically nontransparent, electrically conductive layer using a scanning probe process apparatus to form, over an optical window, a light-permeable protective insulation structure of a region of the optical window on the substrate surface beneath the light-permeable protective insulation structure.

7 Claims, 5 Drawing Sheets

METHOD OF FABRICATING A PHOTO-DEVICE

This is a continuation of application Ser. No. 08/590,345 filed on Jan. 23, 1996 now U.S. Pat. No. 5,661,328.

BACKGROUND OF THE INVENTION

1. Field of the Invention

The present invention relates to an improved photo-receiving device for converting light signals to electrical signals, as required in such fields as communications and information processing, and to an improved method of fabricating a photo-device, which also means a light emitting device for converting electrical signals to light signals.

2. Description of the Prior Art

The term photoelectric conversion as used herein refers to the function of converting a light signal to an electrical signal in a photo-receiving device, and also to the function of converting an electrical signal to a light signal in a light emitting device. FIG. 8 illustrates the structure of a conventional photo-receiving device 50 as described in the IEEE Journal of Quantum Electronics (Vol. 28, pp. 2358–2368, 1992) for converting light signals to electrical signals at a relatively high speed. As shown, the photo-receiving device 50 comprises a substrate 11 that constitutes the photoelectric conversion portion (which can also be referred to as a light-absorbing portion, as this is a photo-receiving device), and a pair of opposed electrode portions 51, each in the form of a thin film of metal, formed on the surface of the substrate 11. The exposed surface of the substrate 11 between the electrodes 51 forms an optical window 13 for the entry of the light $I_p$ to be detected.

When light $I_p$ impinges on the optical window 13 while an appropriate voltage is being applied to the pair of electrodes 51, excited carriers (electrons and holes) are generated in the substrate 11. Holes, shown in the drawing as blank circles, are drawn to the electrode 51 with the relatively negative (−) potential, and electrons, shown as solid circles, are drawn to the electrode 51 with the relatively positive (+) potential, setting up a flow of a photoelectric current (photo detection current) which takes place via the electrodes 51, whereby the incidence of the light $I_p$ is detected.

With this type of conventional photo-receiving device 50 of FIG. 8, which is generally referred to as a MSM (metal/semiconductor/metal) device, the smaller the width W of the optical window 13, that is, the smaller the distance between the electrodes 51, the faster the operating speed of the device is, and raising the applied voltage increases device speed and sensitivity. Also, making the width W of the optical window 13 no larger than the wavelength of the light $I_p$ to be detected imparts an evanescent field to the light $I_p$ impinging on the light-absorbing substrate 11 and causes the incident light $I_p$ to be absorbed in the vicinity of the surface of the substrate 11. At the same time, as the field strength set up by the electrodes 51 is higher at the surface of the substrate 11 than in the interior, the excited carriers generated in the vicinity of the surface of the substrate 11 are drawn rapidly to the electrodes 51, enabling higher speed operation to be achieved and the affect of carrier recombination to be reduced.

In the case of the photo-receiving device 50 of FIG. 8, reducing the width W between the electrodes 51 to around 300 nm by means of electron beam lithography, an existing line pattern process technology, resulted in a pulse-response full width at half maximum output of 870 fs, which is quite a high speed compared to other photo-receiving devices. However, it is difficult to achieve higher speeds, for the following reasons.

A first problem is that, since the optical window 13 on the surface of the substrate 11 between the electrodes 51 is exposed, applying a higher voltage across the electrodes 51 giving rise to creeping discharge along the exposed surface of the optical window 13 and air-gap discharge, rendering the device unusable. That is, if the width W between the electrodes 51 is reduced beyond a certain limit, even a low voltage causes a dielectric breakdown. On the other hand, even in cases where the width W of the incident light window 13 can be increased, within the limitation that it does not exceed the wavelength of the incident light $I_p$, there are major constraints on the voltage that can be applied. A second problem is that of the limits of the process technology. Even with existing electron beam lithography, a relatively high precision line pattern process technology, an electrode gap cannot really be precision-fabricated to a width W of 100 nm or less, and even 300 nm or less is quite difficult.

A conventional method of resolving the first problem is to cover, or bury, the exposed surface portion constituting the optical window 13 between the electrodes 51. This will now be described, with reference to FIG. 9. The following description is not limited to photo-receiving devices, being also applicable to devices, such as light emitting devices, having a light emitting area defined in the form of an optical window. Thus, reference numeral 52 is used to denote the photo-device shown in FIG. 9, the light-absorbing portion 11 of FIG. 8 is the photoelectric conversion portion in the general meaning of the term, and the term metallic film electrodes 51 is encompassed by the term optically non-transparent conductive film (electrodes) 12. To fabricate the photo-device 52, existing lithographic technology is used to remove a prescribed region of an optically nontransparent conductive film 12 formed on photoelectric conversion portion 11, thereby exposing a defined portion that forms an optical window 13.

Sputtering or another such vapor deposition technique is then used to form an optically transparent protective insulation layer 53 over the optical window 13. However, sputtering and other such vacuum vapor deposition apparatuses are costly, so there is no objection to achieving the required result by other means. Also, while the optically nontransparent conductive film 12 in which the optical window 13 region is formed (defined) and the insulation layer 53 to protect the optical window 13 are formed using separate, processes, device fabrication can be simplified by effecting both processes in one step. As described, even with the relatively high patterning precision provided by a technology such as electron beam lithography, the minimum width W of the optical window 13 that can be formed in the optically nontransparent conductive film 12 is in the order of 300 nm.

Non-uniformities in the thickness of the surface deposition film gives rise to variation in device characteristics, and high frequency characteristics can be degraded by dielectric deposits. When a very fine optical window is used, forming a high-quality insulative film over the window that has high dielectric resistance is difficult.

An object of the present invention is to provide a high speed photo-receiving device in which constraints relating to the width W of the optical window between electrodes, and to the applied voltage, are reduced.

Another object of the present invention is to provide a photo-receiving device that is more highly functional and multifunctional than conventional photo-receiving devices.

Yet another object of the present invention is to provide a method of fabricating a photo-device wherein an optical window region and a protective layer over the optical window surface can be formed in one step.

A further object of the present invention is to provide a method of fabricating a photo-device that enables the above-described drawbacks to be resolved or alleviated and an optical window to be formed to have a smaller width than that of conventional photo-devices.

SUMMARY OF THE INVENTION

To attain the above objects, the present invention provides a photo-receiving device, comprising a light-absorbing substrate, a pair of electrodes disposed on a surface of the light-absorbing substrate, an optical window through which light to be detected enters, said optical window being an exposed surface portion of the substrate between the electrodes, and an optical guide structure provided on the exposed surface portion of the substrate between the electrodes, said optical guide being permeable to the light to be detected, having a width that does not exceed a wavelength of the light to be detected, and exhibiting a higher resistance than that of the substrate.

With this configuration, the electrodes can be brought closer together than in a conventional configuration without risk of dielectric breakdown between the electrodes. This means a stronger electrical field can be applied, which increases the speed of the photocarriers and reduces the effect of carrier recombination, resulting in a photo-receiving device that exhibits high speed as well as high sensitivity. Moreover, the optical guide also serves as a protective layer over the exposed surface portion of the substrate that constitutes the optical window. This eliminates the need to separately form a protective layer, thereby simplifying the fabrication process and reducing fabrication cost.

The present invention also provides a photo-receiving device in which the optical guide is formed of an insulating material. The insulator may be an oxide of the thin film material used to constitute the electrodes.

The invention also provides a photo-receiving device in which the optical guide may be formed of a semiconductor material, provided the semiconductor material exhibits higher resistance than the light-absorbing substrate.

In another embodiment, the invention also provides a photo-receiving device in which the optical guide is formed of materials having different properties.

The invention also provides a photo-receiving device in which optical guide properties such as refractive index, absorption coefficient, polarization direction and the like can be varied. In such an arrangement, control electrodes can be included to apply voltage for effecting the adjustment of the optical properties of the optical guide. At least one of the control electrodes may be constituted by one of the above described pair of electrodes. A semiconductor superlattice structure or Fabry-Perot resonator are representative examples of the type of arrangement that may be used to vary the optical properties of the optical guide.

In accordance with another embodiment, the present invention also provides a photo-receiving device in which the insulation creepage distance between the electrodes is increased by making the thickness of the optical guide greater than the thickness of the electrodes.

In accordance with a further embodiment, the photo-receiving device has a plurality of optical guides arranged in parallel between the pair of electrodes, and means each provided between adjacent optical guides so as not to transmit the light to be detected.

The method of fabricating a photo-device according to the present invention comprises a step of forming an optically nontransparent, electrically conductive layer on a surface of a photoelectric conversion substrate, and a step whereby a portion of the optically nontransparent, electrically conductive layer is transformed to form over the optical window a light-permeable protective insulation structure of a prescribed width and length, and at the same time define an optical window region on the substrate surface beneath the protective insulation structure.

The optically nontransparent, electrically conductive layer may be of a metal or an alloy, or a semiconductor (including semi-insulators), or may include a semiconductor superlattice structure.

In this way, a photo-device is fabricated to have a prescribed area on a surface of the photo-receiving or photo-emitting photoelectric conversion substrate forming an optical window of a prescribed width via which light is received or emitted. When it is a photo-device that requires that an optically nontransparent, electrically conductive layer be formed at each side of the optical window, the defined optical window region and an insulation structure for protecting the optical window can be formed in a single step. This is highly efficient and eliminates the need to use a costly vacuum vapor deposition apparatus to form the protective layer over the entire surface.

In one embodiment of the method of fabricating a photo-device, oxidation is the process used to transform the optically nontransparent, electrically conductive layer. This oxidation can be effected using a scanning probe apparatus.

With this method, a line optical window having a width that does not exceed the wavelength of the light to be detected, and a high-quality, highly dielectrically-resistant protective insulative structure for the optical window can both be formed by the same step. The result is that carrier speed is increased by applying a high field strength while the effect of carrier recombination is decreased, thus providing a photo-device that is faster and more sensitive.

The method for fabricating a photo-device according to this invention also comprises transforming multiple mutually separated portions of the optically nontransparent, electrically conductive layer.

The present invention also provides a method of fabricating a photo-device in which the photoelectric conversion substrate is of a light-absorbing material having a light receiving function, a non-transformed portion of the optically nontransparent, electrically conductive layer functions as an electrode to apply a voltage to the light-absorbing substrate, and the protective insulation structure functions as an optical guide that directs light to the substrate.

The present invention also provides a method of fabricating a photo-device whereby the thickness of the protective insulation structure preferably is thicker than the thickness of the non-transformed portions of the optically nontransparent, electrically conductive layer at each side, and when said portions of the layer remaining at each side are utilized as a pair of electrodes, the insulation creepage distance between the electrodes is increased, thereby increasing the resistance to dielectric breakdown.

Further features of the invention, its nature and various advantages will be more apparent from the accompanying drawings and following detailed description of the invention.

DESCRIPTION OF THE PREFERRED EMBODIMENTS

Figure 1A:
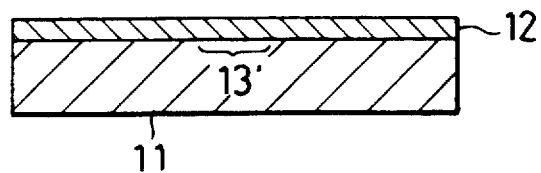
FIG. 1 illustrates a method of fabricating the photo-device according to an embodiment of the invention.
Figure 1B:
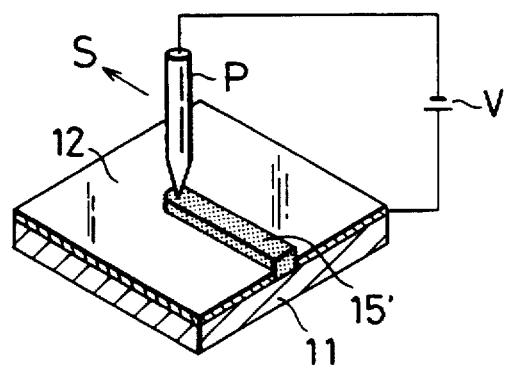
Figure 1C:
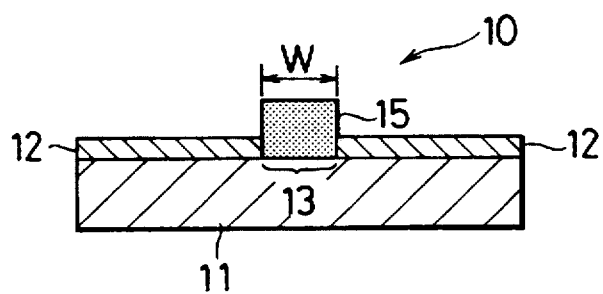

FIG. 1 shows an example of basic steps or processes used to fabricate a photo-device according to the method of the invention. In this and other embodiments, parts corresponding to parts in the conventional devices 50 and 52 of FIGS. 8 and 9, already described, are given the same reference numerals.

FIG. 1 (A) shows a conductive, optically nontransparent film layer 12 formed on a surface of a light receiving or light emitting photoelectric conversion substrate 11. The internal constitution of the substrate 11 is not specifically defined by the invention, and may be comprised in accordance with existing device structural principles. If the device is formed as a conventional MSM photo-receiving device, as described in the foregoing, the substrate 11 will function as a light-absorber, and in terms of material, will be formed of a bulk semiconductor such as GaAs. The film 12 may be formed of a suitable metal (including alloys) or semiconductor, including a semiconductor having a superlattice structure. In broad terms, a material that is at least non-permeable, or has very low permeability, to the light to be detected, in the case of a photo-receiving device, and to the emitted light, in the case of a light-emitting device, and has significant electrical conductivity, can be regarded as being applicable for the purpose of the invention.

Starting from the structure shown in FIG. 1 (A), the properties of a region of the optically nontransparent layer 12 corresponding to a region 13' in which an optical window 13 will ultimately be formed are transformed to form an insulation structure that is light-permeable (that is, transparent or semitransparent to light that is to be detected or transmitted, as the case may be). Preferably this is done by using a scanning probe apparatus to oxidize the region concerned. A scanning tunneling microscope (STM) and an atomic force microscope (AFM) are examples of apparatuses that can be used for this. In the case of an STM, for example, the tip of the probe P is brought close to the film 12 and a power source V is used to apply a high-voltage electrical field across the space between the probe tip and the film 12 while at the same time the probe P is scanned in a direction S. This oxidizes the film 12 along the line of the scan, forming an insulation line 15' that is light-permeable.

Using this method, the present inventors were able to form a titanium oxide line with a minimum width of 18 nm by oxidizing a titanium layer deposited on a GaAs substrate. The same result was also obtained with an AFM. While not directly related to this invention, with an AFM the target film does not have to be electrically conductive.

When the line 15' has been formed to the prescribed length, a light-permeable protective insulation structure 15 having a prescribed width and length is formed to protect the optical window, and the same formation process is used to define a region for the optical window 13 on the substrate surface beneath the structure 15, as shown in FIG. 1 (C). This simplifies the fabrication process by eliminating the need for separately forming a film over the entire surface for an optical window protective layer after first forming the optical window, such as is required in the case of the conventional device shown in FIG. 9.

With a photo-device 10 fabricated according to this invention, moreover, the remaining nontransformed portions of the optically nontransparent conductive film 12 at each side of the protective insulation structure 15 can be used as electrodes. Since in such a case the insulation structure 15 is disposed between the electrodes 12, the insulation creepage distance is increased, enhancing the resistance to dielectric breakdown. Increasing the thickness of the structure 15 to above a certain level also enhances insulation capabilities.

Thus, it is possible to apply a higher voltage across the electrodes 12 while using around the same separation width W as a conventional device. Conversely, this means that for the same applied voltage, a higher field strength can be obtained in the vicinity of the substrate 11 by reducing the distance between the electrodes 12. This is highly advantageous when the method of this invention is applied to the fabrication of an MSM photo-receiving device. With the use of a scanning probe apparatus to process the optically nontransparent conductive film 12, the width W of the optical window 13 (that is, the distance between the electrodes 12) can be reduced down to little more than ten nanometers, while at the same time ensuring the high insulation quality of the protective structure 15.

Figure 2:
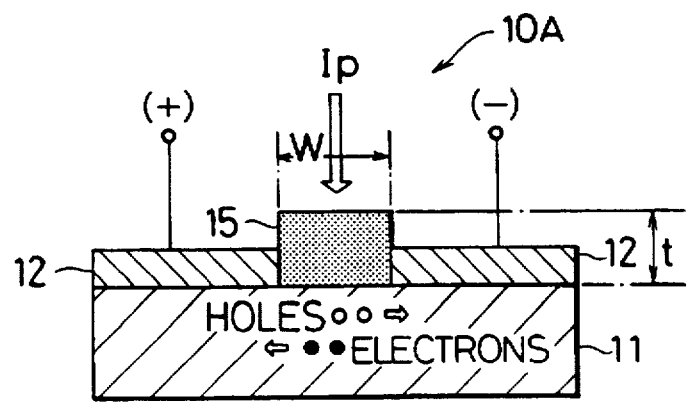
FIG. 2 shows the general configuration of an embodiment of the photo-receiving device of the invention.
Figure 3A:
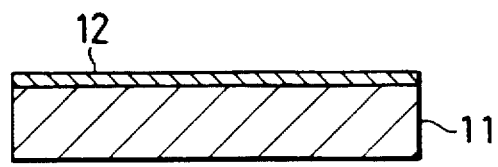
FIG. 3 illustrates steps used in the fabrication of an MSM photo-receiving device in accordance with the method of fabricating a photo-device of the invention.
Figure 3B:
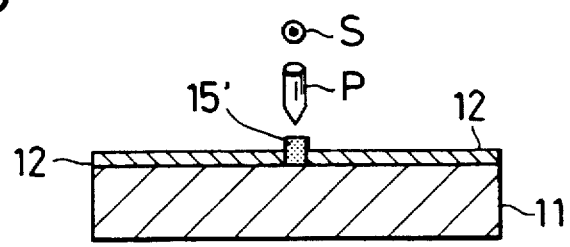
Figure 3C:
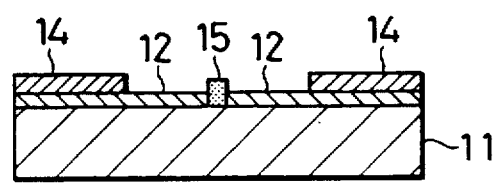
Figure 3D:
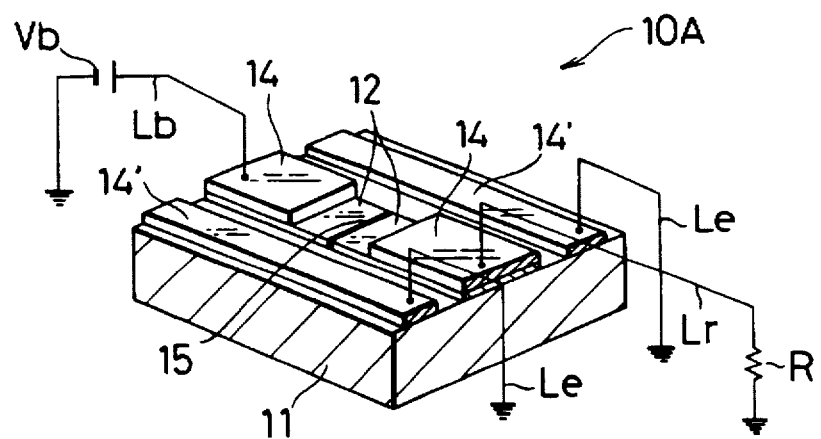

FIG. 2 is a cross-sectional view of a photo-receiving device 10A according to the present invention. The photo-receiving device 10A comprises a light-absorbing substrate 11 of GaAs or other such suitable semiconductor on which a pair of electrodes 12 is formed, with the space between the electrodes 12 forming an optical window 13 FIG. 1c light entry. The electrodes 12 are usually of titanium or other such metal, but can also be formed of silicon or another such semiconductor which has been made conductive by the introduction of an appropriate impurity. The light-absorbing substrate 11 can be used as the structural substrate of the photo-receiving device 10A, this is not limitative, as the illustrated structure can be formed using a physical support substrate other than the one shown.

Figure 8:
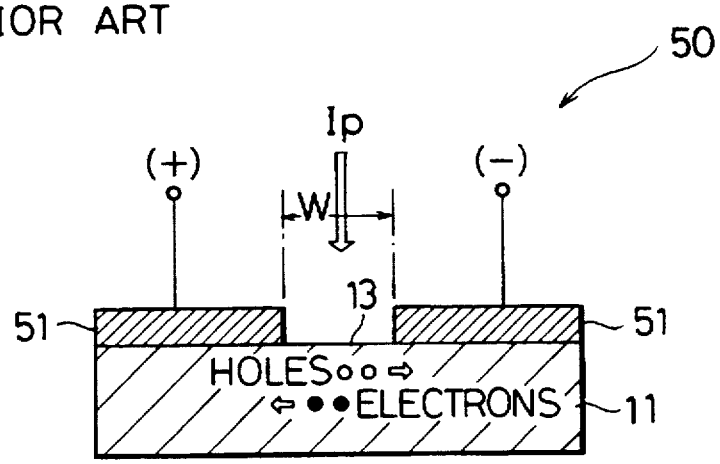
FIG. 8 shows the arrangement of a conventional MSM photo-receiving device.
Figure 9:
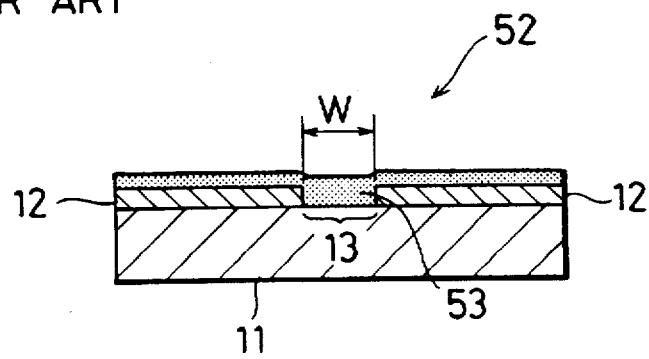
FIG. 9 illustrates a conventional protective structure for an optical window.

In the case of the conventional photo-receiving device 50 shown in FIG. 8, the optical window 13 is in the form of a portion of the surface exposed to the air. In contrast, the optical window portion of the photo-receiving device 10A is provided with a protective insulation structure formed of a suitable insulation material such as titanium oxide, silicon oxide or silicon nitride. As well as protecting the optical window by covering the exposed portion of the substrate 11, this structure 15 also serves as an optical guide. This optical guide 15 needs to at least be light-permeable, that is, transparent or semitransparent with respect to the light $l_p$ to be detected. The above are examples of materials that can be treated as transparent to light of most wavelengths.

Since in this arrangement the portion of the substrate 11 between the electrodes is not exposed, it eliminates or alleviates the surface discharge on the exposed surface of the substrate window 13 that is a problem with the conventional arrangement, and, using the same width W between electrodes 12 as a conventional configuration, enables a higher voltage to be applied. It is desirable to make the thickness t of the optical guide 15 greater than the thickness of the electrodes 12. Doing this increases the creeping distance between the electrodes 12 by an amount corresponding to the increase in thickness, thus providing adequate resistance to the type of air gap discharge across the electrodes 12 to which the conventional device arrangement is prone. Therefore, while in the case of a conventional device configuration the risk of dielectric breakdown imposes constraints on how close the electrodes 12 can be brought together, thereby placing an upper limit on the voltage that can be applied, in the photo-receiving device 10A of this invention such constraints are considerably reduced.

As has been described in the foregoing, when the width W of the optical window 13 is made to not exceed the wavelength of the light $I_P$ to be detected, the light $I_P$ impinging on the light-absorbing substrate 11 appears as an evanescent photoelectric field, the photoelectric field strength is increased just in the vicinity of the surface of the substrate 11 and the incident light $I_P$ is absorbed in said vicinity of the substrate 11 surface. Since in the inventive photo-receiving device 10A a higher voltage can be applied across the electrodes 12 than in a conventional device, and the electrical field strength is therefore higher at the surface than inside the substrate, excited carriers (electrons and holes) generated by the incident light $I_P$ in the vicinity of the surface of the substrate 11, close to the electrodes 12, are drawn at high speed to the respective electrode (the relatively positive electrode in the case of electrons, and relatively negative electrode in the case of holes). In other words, photoelectric conversion (photodetection) can be effected at a higher speed. Moreover, the high speed at which the carriers are drawn away as a result of the high voltage applied means that less recombination takes place, which helps to increase the sensitivity and output of the device.

FIG. 3 shows more details of the process used to fabricate the MSM photo-receiving device 10A of FIG. 2 according to the method of this invention. With reference first to FIG. 3 (A), a full-surface conductive layer 12 of titanium is deposited on a GaAs semiconductor substrate 11. A STM probe P is positioned near a prescribed surface portion of the titanium layer 12, as shown in FIG. 3 (B), and a potential of 5 V is applied between the probe P and the layer 12 under atmospheric conditions (that is, in an environment that includes moisture), setting up a tunneling current, while at the same time the probe is scanned in a direction S normal to the drawing sheet. The scanning speed is set to produce a titanium oxide line 15' having a width of 100 nm. Considerable control over the width and thickness of the line 15' can be exercised by adjusting the voltage and scanning speed. The width of the line 15' can be increased by also oscillating the probe P to each side of the scan line. The titanium line 15' thus formed to a prescribed length constitutes the optical guide 15, and the non-oxidized portions of the titanium layer at each side form electrodes 12. Thus, the fabrication of the electrodes 12 and the optical guide 15 between the electrodes 12 is rationalized into a single procedure.

With reference to FIG. 3 (C), mounting electrodes 14 of Ti/Au, for example, are formed at a desired portion on the electrodes 12 to facilitate a connection to an external circuit that may be required. With reference to FIG. 3 (D), ground electrodes 14' of Ti/Au, for example, are formed parallel to a stripe that includes electrodes 12 and optical guide 15. In this example, stripes are each 5 μm wide and are 5 μm apart. This enables a bias line Lb that applies a bias voltage Vb to be connected to one of the electrodes 12, and a signal line Lr to a resistance load R to be connected to the other electrode 12, and a ground line Le to be connected to each of the ground electrodes 14' forming a shield structure.

Figure 4:
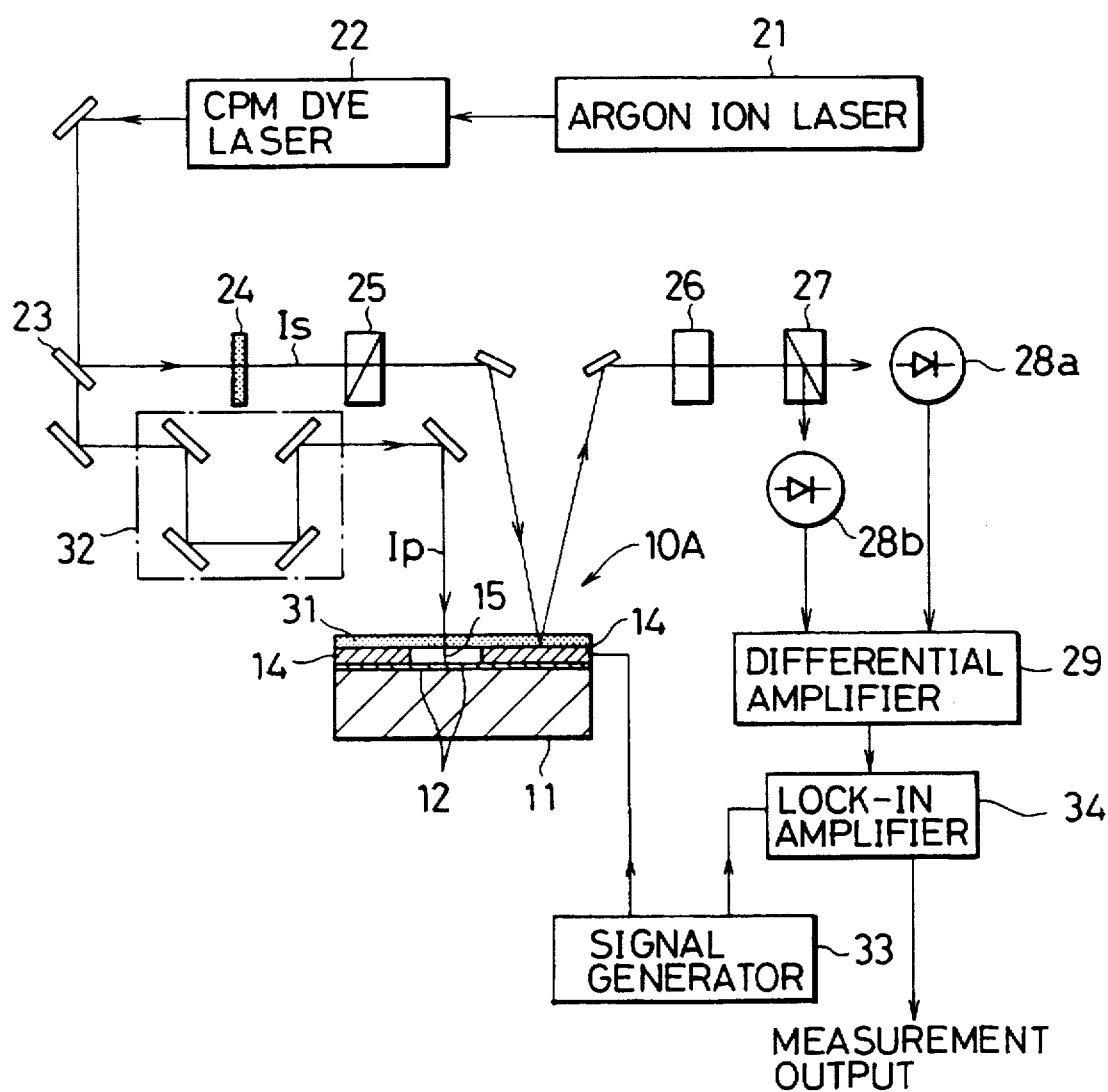
FIG. 4 is a diagram of a system used to measure a photo-receiving device fabricated by the steps of FIG. 3.

The measurement system shown in FIG. 4 was used to evaluate the thus-fabricated photo-receiving device 10A, using the electro-optical sampling method. This is a method in which polarization changes in a laser beam corresponding to changes in the electrical field of an electro-optical crystal disposed on the circuit to be measured are detected, producing an electrical signal that is measured at a time resolution in the femtosecond range. The light source was a colliding pulse mode-locked (CPM) dye laser 22, fed by an argon ion laser 21, with an output of around 10 mW, an output pulse width of 40 fs, and a wavelength of 620 nm. The titanium oxide optical guide 15 of the photo-receiving device 10A exhibited adequate transparency to this light of wavelength 620 nm, and satisfactory electrical insulation properties. The beam from the CPM dye laser 22 is split by a 9:1 beam splitter 23 into an exciting beam $I_P$ and a sampling beam Is, respectively. The exciting beam $I_P$ is passed through a variable delay apparatus 32 to adjust the difference with respect to the light path of the sampling beam Is, and is then directed into the optical guide 15 of the photo-receiving device 10A. The sampling beam Is is passed through a half-wave plate 24 and polarizer 25 to adjust the polarization direction, and then into an electro-optical (EO) probe 31. The EO probe 31 is a $LiTaO_3$ plate 300 μm long, 250 μm wide and 50 μm thick, with an electro-optical coefficient of 35.8 pm/V, and has a multilayer, dielectric antireflection coating on the rear surface of the crystal in contact with the photo-receiving device. The crystal orientation of the EO probe 31 and the polarization direction of the sampling beam Is are set for optimum sensitivity with respect to an electrical field perpendicular to the stripe.

Figure 5:
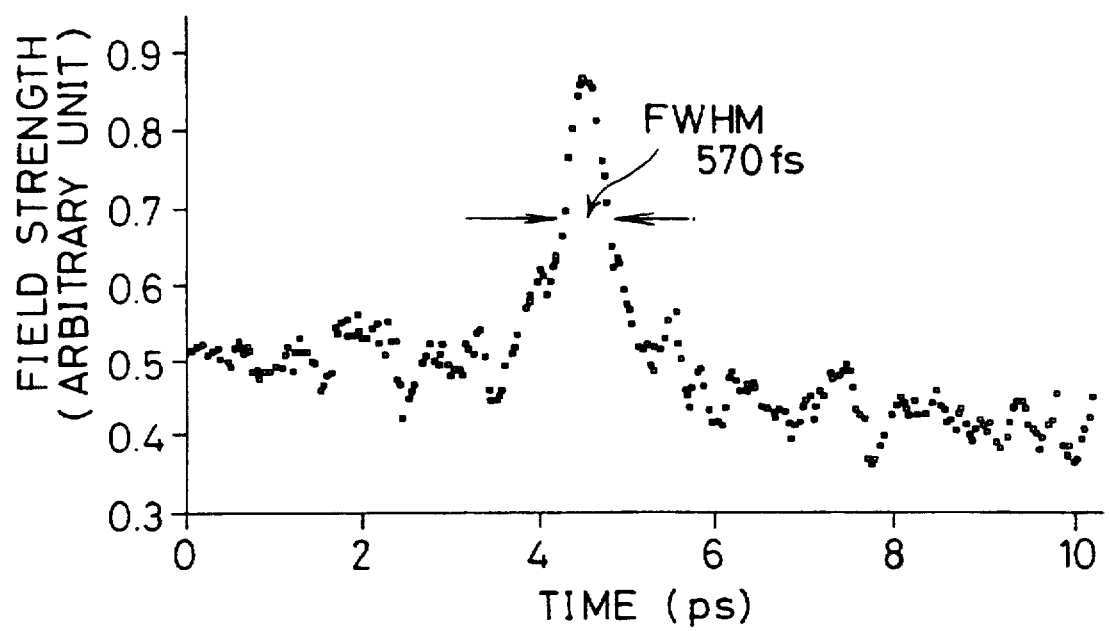
FIG. 5 shows the measurement results obtained with the fabricated photo-receiving device.

The reflected sampling beam Is phase modulated by electrical field permeation into the EO probe 31 is subjected to phase compensation by a Babinet-Soleil compensator 26, deflected by a polarizing beam splitter 27 and intensity modulated by a pair of photoreceivers 28a and 28b. The outputs of the photoreceivers 28a and 28b are passed through a differential amplifier 29 to a lock-in amplifier 34 and thereby locked in to the same 1 MHz that is applied to the fabricated device by a signal generator 33. FIG. 5 displays a plot of the measurement results based on the output of the lock-in amplifier 34. The vertical axis is field strength and the horizontal axis is time. With measurements taken at a point 70 μm from the photo-receiving device 10A, a full width at half maximum (FWHM) electrical-pulse value of 570 fs was obtained. At a 3 dB region this is equivalent to 790 GHz, which, without dispute, is at this point world record speed for this type of photoconductive photo-receiving device.

Thus, the device fabrication of this invention makes it possible to define the region for the optical window 13 and to form the protective insulation structure (optical guide) 15 for the optical window 13 in a single process. In addition to this basic effect, it enables the optical window 13 to be formed to a width as fine as around 100 nm, so it does not exceed the wavelength of the light to be detected, and the formation of a protective insulation structure 15 that exhibits high quality and high dielectric resistance. Applying the method to the fabrication of an MSM photo-receiving device results in a device that combines high speed with high sensitivity.

Specifically, when the width W of the optical window 13 is no larger than the wavelength of the light to be detected, the light $I_p$ impinging on the light-absorbing substrate 11 appears as an evanescent photoelectric field, the photoelectric field strength is increased just in the vicinity of the surface of the substrate 11 and the incident light is absorbed in this substrate 11 surface vicinity. Because the photo-receiving device 10A is provided with the high quality protective insulation structure 15, with its high dielectric resistance, compared to a conventional device a higher voltage can be applied across the electrodes 12, and the electrical field strength is therefore higher at the surface than inside the substrate, excited carriers (electrons and holes) generated by the incident light $I_p$ in the vicinity of the surface of the substrate 11, close to the electrodes 12, are drawn at high speed to the respective electrode (the relatively positive electrode in the case of electrons, and relatively negative electrode in the case of holes). In other words, photoelectric conversion (photodetection) can be effected at a higher speed. Moreover, the high speed at which the carriers are drawn away as a result of the high voltage applied means that less recombination takes place, which helps to increase the sensitivity and output power of the device. This invention provides a device that is faster and more sensitive than a conventional device. This is because even if, in the device of this invention, the width W of the gap between the electrodes 12 is increased to more than the 300 nm of a conventional device, while observing the provision that the width W does not exceed the wavelength of the light to be detected, the lower risk of a dielectric breakdown occurring means that a higher voltage can be applied across the electrodes 12. Doing this would ease the fabrication process burden. An example is the above-described processing method in which a scanning probe apparatus is applied to the formation of the protective insulation structure 15; for example, forming an oxide line of a desired width by oscillating the probe P to each side of the scan line, as described above. Instead, it would be possible to use a different existing fine pattern process technology, such as electron beam lithography or selective epitaxis.

Modifications of the invention will now be described. First, the protective insulation structure/optical guide 15 does not have to be an insulator. It is only required that it be located between the electrodes 12 and exhibit higher resistance than that of the substrate 11, and as such may be formed of a semiconductor based on an insulation material. If GaAs is used for the substrate 11, for light-permeability (minimal photo-absorption) the structure 15 could be formed of AlAs, GaP or other such semiconductor having a larger band-gap than that of the GaAs. However, when such a semiconductor is used to form the optical guide 15, to ensure complete insulation a small gap should be left between the guide 15 and at least one of the electrodes 12 and this gap filled with an insulation material. This corresponds to an embodiment in which the optical guide 15 is constituted of materials having different properties.

Figure 6:
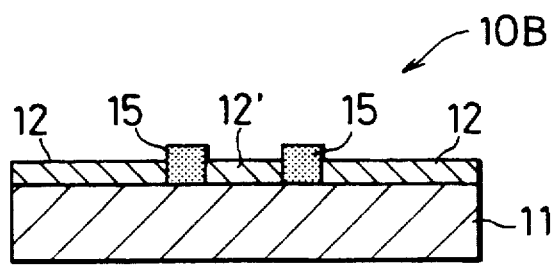
FIG. 6 shows the configuration of another photo-receiving device fabricated according to the method of the invention.

FIG. 6 shows an embodiment of a photo-receiving device 10B in which the optical window is provided with two or more discernible optical guides 15 (only two are shown in the drawing), and a nontransparent interstitial portion or means 12' is provided between adjacent guides 15. The detection sensitivity can be increased by the number of optical guides 15 having a width not exceeding the wavelength of the light to be detected. In principle the interstitial means 12' may be conductive or insulative, but preferably are conductive, since that enables them to be formed of the same material as the film used to form the electrodes 12 at each side. Any desired fine pattern process technology may be used to form the optical guides 15. A scanning probe based process is highly rational, as it enables the process used to form the guides 15 to be utilized to also form the electrodes 12 and interstitial means 12', all at the same time.

As has already been mentioned, it is possible for the optical guides 15 to be formed of a mixed multiplicity of materials having different properties, such as insulators and semiconductors, as long as this does not depart from the defined scope of the invention. Moreover, the optical guides 15 may include a structure that enables the optical properties of the guides to be varied. Such a facility is included in the device 10C shown in FIG. 7. In this arrangement, part of the optical guide 15 formed in the optical window has a multilayer structure comprising, from the side in contact with the substrate 11, an n-type (or p-type) semiconductor layer 37, a GaAs/AlGaAs or InAs/InGaAs superlattice layer 39, and a p-type (or n-type) semiconductor layer 38. On top of this is a nontransparent protective insulation structure 15" formed of a single insulation or semiconductor material. For external control of optical properties, a contact electrode 36 of a metal or semiconductor substance is provided that extends down through the structure 15" to form an electrical contact with the semiconductor layer 38. The semiconductor layer 37 is also provided with a control electrode. In this example, one of the electrodes 12 (the one on the left of the drawing) also functions as this contact electrode.

With this arrangement, an electrical field can be applied to the superlattice layer 39 by applying an external voltage between one of the electrodes 12 and the control electrode 36. The quantum containment Stark effect corresponding to the strength of the electrical field changes the absorption coefficient and refractive index with respect to wavelengths in the vicinity of the ends of the bands, making it possible to control the absorption peak of the excitons, the appearance of which is a characteristic feature of quantum structures. The spectrum of the incident light $I_p$ can therefore be established from changes in the absorption coefficient for each wavelength, which can be used to improve the functional quality and range of a photo-receiving device. A Fabry-Perot resonator structure can be incorporated in the optical guide 15 to provide a photo-receiving device with wavelength selectivity, as the resonance wavelength can then be controlled by using the application of an outside voltage to electrodes 12 and 36 to control the refractive index. Such an arrangement could be envisaged, with reference to FIG. 7, by viewing the superlattice layer 39 as the requisite internal waveguide of the resonator and the upper and lower layers 37 and 38 as being both reflectors and refractivity control electrodes. In accordance with this invention, such an embodiment also includes other structures for controlling optical properties.

Figure 7:
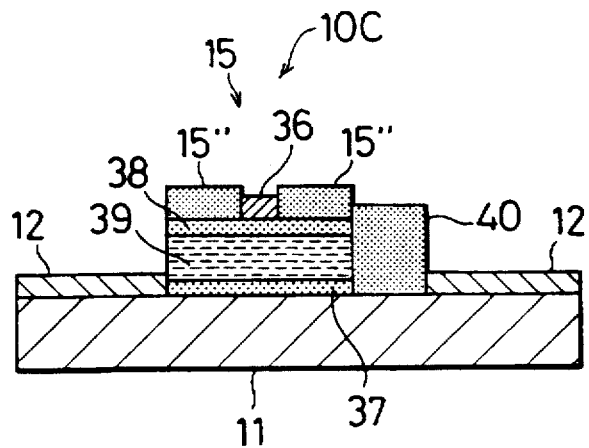
FIG. 7 shows the configuration of another photo-receiving device fabricated according to the method of the invention.

In the configuration shown in FIG. 7, an insulation layer 40 is disposed between the electrode 12 on the right and the optical guide 15 that includes the superlattice layer 39, to prevent the semiconductor layer 37 from causing an electrical short between the electrodes 12. Although a gap may be used for this instead of the insulation layer 40, providing the layer 40 is not complex, since it can be formed at the same time as the insulation structure 15".

Other modifications and variations of the present invention clearly are also possible in light of the above teachings. It is therefore to be understood that within the scope of the appended claims, the invention may be practiced otherwise than as specifically described herein.

What is claimed is:

1. A method of fabricating a photo-device, comprising a step of forming an optically nontransparent, electrically conductive layer on a surface of a photoelectric conversion substrate, and a step whereby a portion of the optically nontransparent, electrically conductive layer is transformed by a scanning probe process apparatus to form, over an optical window, a light-permeable protective insulation structure of a prescribed width and length, and at the same time define a region of the optical window on the substrate surface beneath the light-permeable protective insulation structure.

2. A fabrication method according to claim 1, wherein the optically nontransparent, electrically conductive layer is of a metal or an alloy.

3. A fabrication method according to claim 1, wherein the optically nontransparent, electrically conductive layer is a semiconductor.

4. A fabrication method according to claim 1, wherein the optically nontransparent, electrically conductive layer includes a semiconductor superlattice structure.

5. A fabrication method according to claim 1, wherein the transformation is oxidation.

6. A fabrication method according to claim 1, wherein the portion of the optically nontransparent, electrically conductive layer that is transformed is transformed in multiple mutually separated locations on said layer.

7. A fabrication method according to claim 1, wherein the photoelectric conversion substrate is a light-absorbing substrate with a photo-receiving function, non-transformed portions of the nontransparent, electrically conductive layer function as electrodes for applying a voltage to the photoelectric conversion substrate, and the light-permeable protective insulation structure functions as an optical guide for directing light into the light-absorbing substrate.

* * * * *